US00RE46311E

(19) United States
(12) Reissued Patent
Kawaguchi

(10) Patent Number: US RE46,311 E
(45) Date of Reissued Patent: Feb. 14, 2017

(54) POWER SEMICONDUCTOR DEVICE

(71) Applicant: KABUSHIKI KAISHA TOSHIBA, Tokyo (JP)

(72) Inventor: Yusuke Kawaguchi, Kanagawa (JP)

(73) Assignee: KABUSHIKI KAISHA TOSHIBA, Tokyo (JP)

(21) Appl. No.: 14/645,251

(22) Filed: Mar. 11, 2015

Related U.S. Patent Documents

Reissue of:
(64) Patent No.: 8,395,204
Issued: Mar. 12, 2013
Appl. No.: 13/233,993
Filed: Sep. 15, 2011

(30) Foreign Application Priority Data

Sep. 17, 2010 (JP) ..... P2010-209160

(51) Int. Cl.
*H01L 29/788* (2006.01)
*H01L 29/78* (2006.01)
(Continued)

(52) U.S. Cl.
CPC ..... *H01L 29/7813* (2013.01); *H01L 29/0626* (2013.01); *H01L 29/4236* (2013.01);
(Continued)

(58) Field of Classification Search
CPC ..... H01L 29/0626; H01L 29/4236; H01L 29/7805; H01L 29/7808; H01L 29/7813
See application file for complete search history.

(56) References Cited

U.S. PATENT DOCUMENTS 5,742,076 A * 4/1998 Sridevan et al. ..... 257/77
5,998,833 A * 12/1999 Baliga ..... H01L 21/823487 257/329
(Continued)

FOREIGN PATENT DOCUMENTS

JP 2002203964 A 7/2002
JP 2005-101514 A 4/2005
JP 2010010263 A 1/2010

OTHER PUBLICATIONS

Chinese Office Action dated Feb. 12, 2015, filed in Chinese counterpart Application No. 201110273464.6, 7 pages (with translation).
(Continued)

*Primary Examiner* — James Menefee
(74) *Attorney, Agent, or Firm* — Patterson & Sheridan, LLP

(57) ABSTRACT

According to one embodiment, a semiconductor device, includes an element unit including a vertical-type MOSFET, the vertical-type MOSFET in including a first semiconductor layer, a second semiconductor layer, a third semiconductor layer, a fourth semiconductor layer, a fifth semiconductor layer sequentially stacked in order, an impurity concentration of the second semiconductor layer being lower than the first semiconductor layer, an insulator covering inner surfaces of a plurality of trenches, the adjacent trenches being provided with a first interval in between, and a diode unit including basically with the units of the element unit, the adjacent trenches being provided with a second interval in between, the second interval being larger than the first interval.

20 Claims, 3 Drawing Sheets

(51) Int. Cl.
*H01L 29/423* (2006.01)
*H01L 29/06* (2006.01)
*H01L 29/40* (2006.01)

(52) U.S. Cl.
CPC ..... *H01L 29/4238* (2013.01); *H01L 29/7805* (2013.01); *H01L 29/7808* (2013.01); *H01L 29/0696* (2013.01); *H01L 29/407* (2013.01); *H01L 29/42368* (2013.01)

(56) References Cited

U.S. PATENT DOCUMENTS 6,037,628 A * 3/2000 Huang ..... 257/329
6,049,108 A * 4/2000 Williams ..... H01L 27/0255 257/155
6,670,658 B2 * 12/2003 Hattori et al. ..... 257/279
6,815,767 B2 * 11/2004 Nakamura et al. ..... 257/330
7,091,573 B2 * 8/2006 Hirler et al. ..... 257/500
7,772,668 B2 * 8/2010 Pan ..... 257/492
2004/0108554 A1 * 6/2004 Hshieh et al. ..... 257/376
2005/0233539 A1 * 10/2005 Takeuchi et al. ..... 438/400
2007/0138546 A1 * 6/2007 Kawamura et al. ..... 257/330
2007/0145411 A1 * 6/2007 Chen ..... H01L 27/0629 257/173
2008/0116512 A1 5/2008 Kawaguchi et al.
2008/0116520 A1 * 5/2008 Grover ..... 257/362
2008/0217649 A1 * 9/2008 Arai et al. ..... 257/139
2009/0072241 A1 * 3/2009 Harris et al. ..... 257/77
2009/0121285 A1 * 5/2009 Kawamura et al. ..... 257/330
2009/0140330 A1 * 6/2009 Yagi et al. ..... 257/330
2009/0146209 A1 * 6/2009 Akiyama et al. ..... 257/334
2009/0194811 A1 * 8/2009 Pan et al. ..... 257/330
2010/0213506 A1 * 8/2010 Willmeroth et al. ..... 257/140
2010/0291767 A1 * 11/2010 Miura ..... C23C 14/165 438/653
2011/0186927 A1 8/2011 Kawaguchi et al.
2011/0298044 A1 * 12/2011 Yagi et al. ..... 257/330
2011/0312138 A1 * 12/2011 Yedinak et al. ..... 438/270

OTHER PUBLICATIONS

Japanese Office Action dated Mar. 18, 2014, filed in Japanese counterpart Application No. 2010-209160, 6 pages (with translation).
Japanese Office Action dated Oct. 15, 2013, filed in Japanese counterpart Application No. 2010-209160, 4 pages (with translation).
Japanese Office Action dated Jul. 8, 2014, filed in Japanese counterpart application No. 2010-209160, 6 pages (with translation).

* cited by examiner

POWER SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

This application is based upon and claims the benefit of priority from prior Japanese Patent Application No. 2010-209160, filed on Sep. 17, 2010, the entire contents of which are incorporated herein by reference.

FIELD

Present embodiments relate to a power semiconductor device.

BACKGROUND

The use of power semiconductor devices including MOSFETs (Metal Oxide Silicon Field Effect Transistors) is rapidly increasing not only in the market of large-current high-breakdown-voltage switching power sources but also, especially in recent years, in the market of power-saving switching for mobile communication apparatuses such as notebook PCs. The power semiconductor devices are used in power-management circuits, safety circuits for lithium ion batteries, or the like. Accordingly, the power semiconductor devices are designed to achieve a low drive voltage that enables the power semiconductor devices to be directly driven with a battery voltage, a low on-resistance, a reduction in capacitance between the gate and the drain, or the like.

For instance, a technology is known in which an n-channel MOSFET with a trench-gate structure is made to have a low on-resistance by narrowing the trench pitch. In a MOSFET with a narrowed trench pitch, among an $n^+$-type source layer and a $p^+$-type contact layer both connected to a source electrode, the $p^+$-type contact layer has a difficulty in securing a large enough contact area for the connection.

For this reason, the potential of a p-type base layer, which is connected to the $p^+$-type contact layer, is difficult to fix to the source potential. Thus, there is a problem that an avalanche resistance of the semiconductor device is lowered.

Avalanche breakdown occurs, for instance, when a surge voltage caused by induced electromotive force is larger than a breakdown voltage of the MOSFET in a switching-OFF operation in an inductive load. Here, the avalanche resistance is the ability to withstand the avalanche breakdown.

Suppose a case where the potential of the p-type base layer is not completely fixed to the source potential. In this case, when holes generated by the avalanche breakdown flow as the electric current through the source electrode, the holes pass under the $n^+$-type source layer. Hence, a potential difference is generated between the source electrode and the p-type base layer, and an npn-type bipolar transistor that is parasitic in the MOSFET is turned ON. Consequently, concentration of the current occurs, and the MOSFET becomes more likely to be broken down.

BRIEF DESCRIPTION OF THE DRAWINGS

FIG. 1 is a schematic diagram showing a structure of a semiconductor device according to a first embodiment of the invention.

DETAILED DESCRIPTION

Figures 1A, 1B:
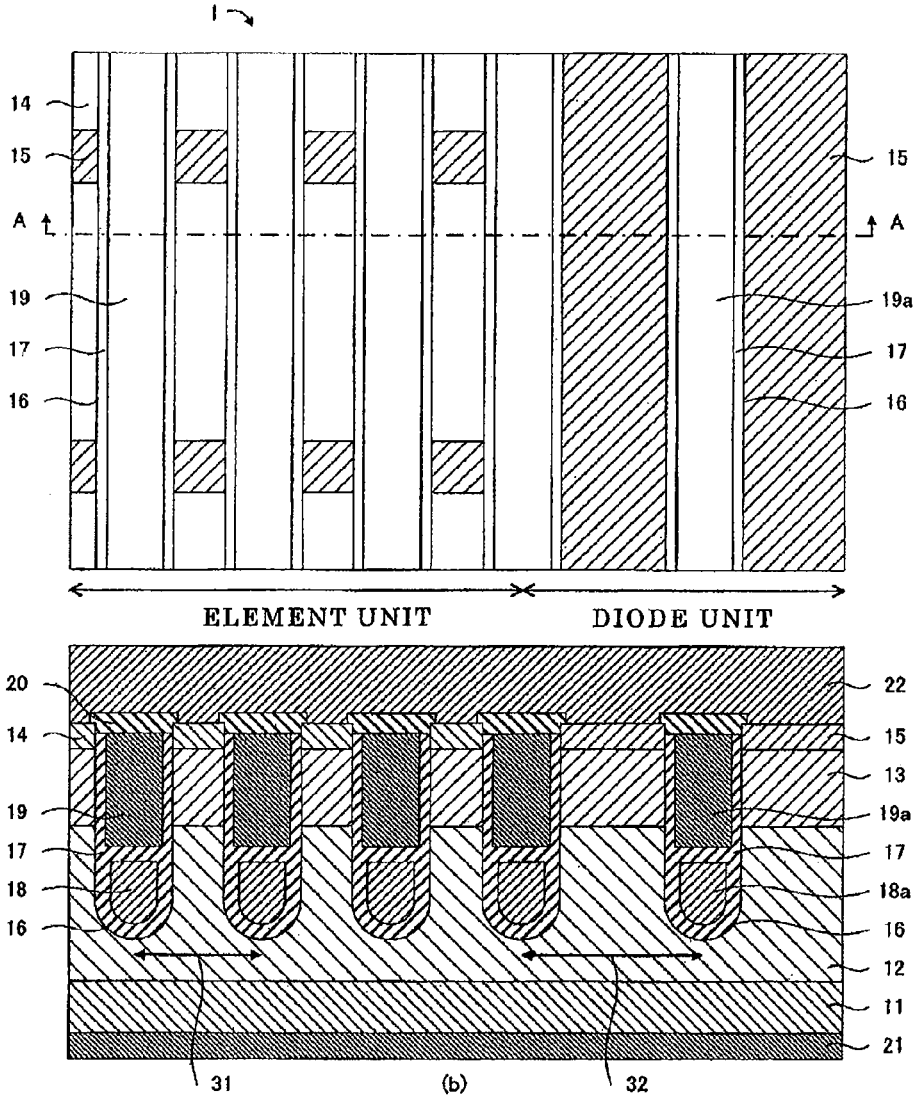
FIG. 1A is a plan view.
FIG. 1B is a cross-sectional view.

According to one embodiment, a semiconductor device includes an element unit comprising a vertical-type MOSFET, the vertical-type MOSFET comprising, a first semiconductor layer with a first conductive type, a second semiconductor layer with the first conductive type provided on a first main surface of the first semiconductor layer, an impurity concentration of the second semiconductor layer being lower than the first semiconductor layer, a third semiconductor layer with a second conductive type provided on a surface of the second semiconductor layer, a fourth semiconductor layer with the second conductive type selectively provided on a surface of the third semiconductor layer, a fifth semiconductor layer with the second conductive type selectively provided on the surface of the third semiconductor layer, an insulator covering inner surfaces of a plurality of trenches, each trench penetrating the third semiconductor layer from a surface of the fourth semiconductor layer or a surface of the fifth semiconductor layer reaching the second semiconductor layer, the adjacent trenches being provided with a first interval in between, a first embedded conductive layer embedded at a bottom of the trench via the insulator, a second embedded conductive layer embedded at an upper portion of the first embedded conductive layer via the insulator, an interlayer insulator provided on the second embedded conductive layer, a first main electrode provided on a second main surface of the first semiconductor layer opposed to the first main surface, the first main electrode electrically connecting to the first semiconductor layer, a second main electrode provided on the a fourth semiconductor layer, the fifth semiconductor layer and the interlayer insulator, the second main electrode electrically connecting to the fourth semiconductor layer and the fifth semiconductor layer; and a diode unit adjacent to the element unit comprising, the first semiconductor layer, the second insulator semiconductor layer, the third semiconductor layer, the fifth semiconductor layer, the insulator covering the inner surfaces of the plurality of the trenches, the adjacent trenches being provided with a second interval in between, the second interval being larger than the first interval, the first embedded conductive layer, the second embedded conductive layer, the interlayer insulator, the first main electrode, and the second main electrode.

Embodiments of the invention are described below by referring to the drawings. In the drawings, the same components are denoted by the same reference numerals. In a semiconductor device, the side where the source electrode is provided is referred to the upper side whereas the side where the drain electrode is provided is referred to as the lower side.

First Embodiment

A semiconductor device according to a first embodiment of the invention is described below by referring to FIGS. 1 and 2. FIG. 1A is a plan view showing the state where two uppermost layers in FIG. 1B (upper portion in the drawing) are removed. FIG. 1B is a cross-sectional view taken along the line A-A in FIG. 1A.

As shown in FIG. 1 shows, a semiconductor device 1 includes an element unit and a diode unit. The element unit includes a region with an n-channel vertical-type MOSFET. The diode unit is provided next to the element unit, and includes a region with a diode. The element unit is on the left side in the drawing whereas the diode unit is provided next to the element unit and is on the right side in the drawing.

The element unit is made of single-crystal silicon, for instance, and includes an $n^+$-type semiconductor substrate 11, which is a first semiconductor layer of a first conductivity type. The element unit includes an $n^-$-type drift layer 12 provided on a first principal surface (the top surface) of the $n^+$-type semiconductor substrate 11. The $n^-$-type drift layer 12 has a lower impurity concentration than the $n^+$-type semiconductor substrate 11, and is an epitaxially-grown, second semiconductor layer of the first conductivity type. The element unit includes a $p^-$-type base layer 13 that is selectively provided on the surface of the $n^-$-type drift layer 12. The $p^-$-type base layer 13 is a third semiconductor layer of a second conductivity type doped with p-type impurities, for instance. The element unit includes $n^+$-type source layers 14 that are selectively provided on the surface of the $p^-$-type base layer 13. The $n^+$-type source layers 14 are fourth semiconductor layers of the first conductivity type doped with n-type impurities. The element unit includes $p^+$-type contact layers 15 that are selectively provided on the surface of the $p^-$-type base layer 13. The $p^+$-type contact layers 15 are fifth semiconductor layers of the second conductivity type doped with p-type impurities.

As shown in FIG. 1A shows, the $n^+$-type source layers 14 and the $p^+$-type contact layers 15 appear alternately in a direction that is normal to the line A-A. To make the on-resistance of the semiconductor device 1 as low as possible, the area of the $n^+$-type source layer 14 is larger than the area of the $p^+$-type contact layer 15 in the plan view.

As shown in FIG. 1, plural trenches 16 are provided in the element unit. Each trench 16 is provided from the surface of either the $n^+$-type source layer 14 or the $p^+$-type contact layer 15, penetrates the $p^-$-type base layer 13, and reaches the $n^-$-type drift layer 12. The trench 16 has a prescribed opening width that is the minimum size allowed by the design rule along the line A-A, and the trenches 16 are arranged along the line A-A at prescribed repeating intervals (pitches 31) that are the minimum distances allowed by the design rule. The trench 16 has a U-shape in a section taken in the direction in which the plural trenches 16 are arranged (i.e., taken along the line A-A), and extends long in a direction that is normal to the line A-A when viewed from the top.

An insulator 17 is provided on the internal surfaces of the trench 16. The insulator 17 is made of a silicon oxide film, for instance. An embedded source electrode 18 is provided at the bottom of the trench 16, i.e., on a side near the $n^-$-type drift layer 12, with the insulator 17 provided between the embedded source electrode 18 and the $n^-$-type drift layer 12. The embedded source electrode 18 is a first embedded electrically-conducting material made of conductive-type polycrystalline silicon, for instance.

In the trench 16, a gate electrode 19 is embedded in a portion above the embedded source electrode 18, that is, on the side near either the $n^+$-type source layer 14 or the $p^+$-type contact layer 15 via the insulator 17. The gate electrode 19 is a second embedded electrically-conducting material made of conductive-type polycrystalline silicon, for instance. The gate electrode 19 starts at the level at least as deep as the bottom surface of the $p^-$-type base layer 13, and reaches the level at least as high as the top surface of the $p^-$-type base layer 13. Thus, the gate electrode 19 allows a channel to be provided in the $p^-$-type base layer 13 on the side surfaces of each trench 16. The embedded source electrode 18 and the gate electrode 19 are isolated from each other by the insulator 17. The embedded source electrode 18 has a width (the dimension measured along the line A-A) that is smaller than the width of the gate electrode 19. As the insulator 17 provided on the side surfaces, the embedded source electrode 18 is thicker than the insulator 17 on the side surfaces of the gate electrode 19. Note that the embedded source electrode 18 and the gate electrode 19 may have the same width.

An interlayer insulator 20 is provided on the gate electrode 19 so as to be in contact with the insulator 17. The interlayer insulator 20 is made of a silicon oxide film, for instance. The gate electrode 19 is thus surrounded by the insulator 17 and the interlayer insulator 20.

A drain electrode 21-a being a first main electrode is provided on a second principal surface (bottom surface) opposite to the first principal surface of the $n^+$-type semiconductor substrate 11. The drain electrode 21 is made of a metal, for instance, and is electrically connected to the second principal surface of the $n^+$-type semiconductor substrate 11. A source electrode 22-a being a second main electrode is provided on the $n^+$-type source layer 14, the $p^+$-type contact layer 15, and the interlayer insulator 20. The source electrode 22 is made of a metal, for instance, and is electrically connected to both the $n^+$-type source layer 14 and the $p^+$-type contact layer 15.

The diode unit has four layers which are the $n^+$-type semiconductor substrate 11, the $n^-$-type drift layer 12, the $p^-$-type base layer 13, and the $p^+$-type contact layer 15. The diode unit has a structure where the $p^+$-type contact layer 15 is provided on the $p^-$-type base layer 13, and the $n^+$-type source layer 14, which is provided in the element unit, is not provided in the diode unit. The four layers provided in the diode unit extend to be continuous with the respective four layers provided in the element unit. Hence, the four layers are named the same as their counterparts in the element unit. If other components that are to be described later extend to be continuous with their counterparts in the element unit, or are provided in the same process as their counterparts in the element unit, such other components are called by the common or similar names. Hence, the components in the diode unit do not always reflect their respective functions. In addition, the element unit and the diode unit share the trench 16 and the components of the trench 16 in the border area.

The trench 16 provided in the diode unit has the same shape as the trench 16 provided in the element unit. The insulator 17, an embedded source electrode material 18a, and a gate electrode material 19a provided in each trench 16 in the diode unit correspond respectively to and have identical structures respectively to the insulator 17, the embedded source electrode 18, and the gate electrode 19 provided in each trench 16 in the element unit.

A pitch 32 between trenches 16 in the diode unit is larger than the pitch 31 between trenches 16 provided in the element unit. As will be described later, the pitch 32 for the trenches 16 in the diode unit is determined by referring to the pitch 31 for the trenches 16 in the element unit and on the basis of the breakdown voltage of the diode.

The source electrode 22 and the drain electrode 21 in the diode unit respectively serve as the anode and the cathode.

Though not illustrated, the source electrode 22 is connected to both the embedded source electrode 18 and the embedded source electrode material 18a. As described earlier, in the element unit, the source electrode 22 has a relatively large contact area with the n-type source layer 14, and has a relatively small contact area with the p-type contact layer 15. Both of these contacts are low resistance contacts. In the diode unit, the source electrode 22 is in contact with the $p^+$-type contact layer 15, and the contact is a low resistance contact. Though not illustrated, both the gate electrode 19 and the gate electrode material 19a are connected to a gate electrode for external connection provided on a surface of the semiconductor device 1.

Next, description is given of the relationship between the pitch 31 in the element unit and the pitch 32 in the diode unit. In the element unit, channels of the MOSFETs are provided at a higher density to achieve a low on-resistance. To achieve a higher channel density, the channels are provided to have the minimum size allowed by the design rule. Since the channels are provided on the side surfaces of the trench in the case of the vertical—type MOSFET with a trench structure, achieving a higher channel density means providing trenches at a higher density. Accordingly, both the opening width of each trench and the repeating interval (pitch) between every two trenches are designed to be minimum allowed by the design rule.

Figure 2:
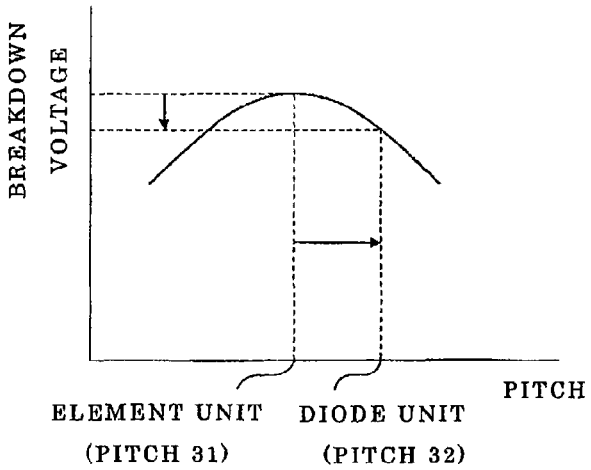
FIG. 2 is a schematic diagram describing the structure of the semiconductor device according to the first embodiment.

FIG. 2 shows the relationship between the breakdown voltage and the pitch for the trenches 16 provided in the element unit. The trench 16 has a double-electrode structure including the embedded source electrode 18 and the gate electrode 19. The horizontal axis of the graph shown in FIG. 2 represents the pitch for the trenches 16 whereas the vertical axis represents the breakdown voltage. The pitch 31 for the trenches 16 in the element unit is determined first to be the minimum distance allowed by the design rule. Then, with the pitch 31 being determined in the above-described way, such parameters as the thicknesses of and the impurity concentrations of the $n^-$-type drift layer 12 and the like around trenches 16 are determined to provide the maximum breakdown voltage.

Consequently, as shown in FIG. 2, the pitch 31 for the trenches 16 in the element unit provides the maximum breakdown voltage. If the pitch for the trenches 16 is changed, the breakdown voltage becomes lower. Nevertheless, since the pitch 31 for the trenches 16 in the element unit is the minimum distance allowed by the design rule, the pitch for the trenches 16 in the diode unit can be made larger only. Then, the breakdown voltage of the diode unit being a voltage at which an avalanche breakdown starts before an avalanche breakdown starts in the element unit is determined to be within a range that exceeds the rated breakdown voltage required for the semiconductor device 1. The thus determined pitch for the trenches 16 is used as the pitch 32. For instance, as indicated by the down-pointing arrow, the breakdown voltage of the diode unit is determined to be lower than the breakdown voltage of the element unit by one to several volts.

In the semiconductor device 1, arrangement of the diode unit relative to the element unit in the plan view is not limited. For instance, in the plan view, the diode unit may be provided in a central portion of the semiconductor device 1, a peripheral portion of the semiconductor device 1, or somewhere in the middle of these two portions. The diode units may also be provided at plural locations. The width of each diode unit may be configured such that multiple diode units are successively arranged with the pitches 32 having the minimum width. The area of the diode unit, or the total areas of the diode units, in the plan view can be determined as desired.

Next, description is given of manufacturing processes of the semiconductor device 1. A process of epitaxially growing the $n^-$-type drift layer 12 on the $n^+$-type semiconductor substrate 11 is the same in manufacturing processes of the element unit and the diode unit. A process of providing the $p^-$-type base layer 13 in the $n^-$-type drift layer 12 by the ion-implantation method is the same in the manufacturing processes of the element unit and the diode unit. The $n^+$-type source layer 14 and the $p^+$-type contact layer 15, which are provided by the ion-implantation method, 15 are arranged differently in the plan view. However, the $p^+$-type contact layer 15 in the diode unit is concurrently with the $p^+$-type contact layer 15 in the element unit. Hence, only a modification in the mask pattern is required. Accordingly, the manufacturing processes of the element unit and the diode unit are the same.

The trenches 16 and the structure of the trench 16 are the same in the element unit and the diode unit, though the pitch 31 for the trenches 16 in the element unit is different from the corresponding pitch 32 in the diode unit. The difference between the pitches 31 and 32 can be dealt with a modification in the mask pattern, so that the trenches 16 including their internal structures are provided in the same manufacturing process in the element unit and in the diode unit. Likewise, the difference in the pitches for the interlayer insulators 20 between the element unit and the diode unit is also dealt with a modification in the mask pattern. Then, the drain electrode 21, the source electrode 22, and the like are provided in the same manufacturing process both in the element unit and in the diode unit. This is because the arrangements in the plan view, of the drain electrode 21, the source electrode 22, and the like are the same both in the element unit and in the diode unit.

The manufacturing of the semiconductor device 1 requires modifications in the mask patterns because the element unit and the diode unit are arranged differently in the plan view. However, the element unit and the diode unit have the same patterns in the sectional view, i.e., in the depth direction. Thus, the addition of the diode unit to the element unit needs no extra manufacturing processes other than the ones necessary for the manufacturing the element unit.

Next, description is given of the operations of the semiconductor device 1 in a switching-OFF operation in an inductive load.

As described earlier, the pitch 32 for the trenches 16 in the diode unit is larger than the pitch 31 for the trenches 16 in the element unit. The trench 16 in the diode unit has the same size as the trench 16 in the element unit. Hence, the distance between every two adjacent trenches 16 in the diode unit is larger than the corresponding distance in the element unit. Accordingly, the $n^-$-type drift layer 12 in the diode unit is less likely to be depleted than the $n^-$-type drift layer 12 in the element unit, so that the breakdown voltage of the diode unit drops and the avalanche breakdown starts at a lower voltage.

When a voltage exceeding the breakdown voltages is applied between the drain electrode 21 and the source electrode 22, an avalanche breakdown occurs in the diode unit with the lower breakdown voltage before the breakdown occurs in the element unit. When the avalanche breakdown occurs, most of the electric current flows into the diode unit. Little current flows in the element unit, so that the parasitic npn-bipolar transistor becomes more difficult to be turned ON. Even when a configuration is impossible to secure a large contact area between the $p^+$-type contact layer and the source electrode 22, the turning ON of the parasitic npn-bipolar transistor is impeded. Therefore, the breakdown of the element unit becomes less likely to occur, and thus the element unit can have larger avalanche resistance.

In the case of a switching-ON operation in the element unit, the semiconductor device 1 can have a lower on-resistance. As described earlier, the trench 16 in the element unit has a double-electrode structure including the embedded source electrode 18 and the gate electrode 19. A depletion layer extends from the $p^-$-type base layer 13 and from the trenches 16 on the both sides. In addition, the pitch 31 is narrow. Hence the $n^-$-type drift layer 12 is more likely to be depleted. Accordingly, the breakdown voltage between the drain electrode 21 and the source electrode 22 becomes higher. Consequently, in comparison to the semiconductor device including trenches each of which has an ordinary electrode structure (single electrode structure), the $n^-$-type drift layer 12 of the semiconductor device 1 can raise its impurity concentration and thus the semiconductor device 1 can lower the on-resistance.

Second Embodiment

Figure 3:
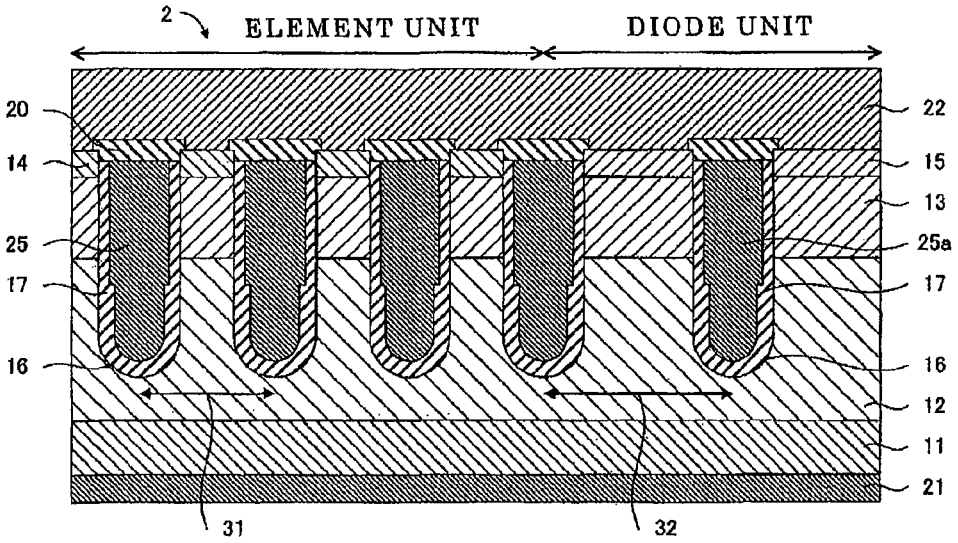
FIG. 3 is a cross-sectional view schematically showing a structure of a semiconductor device according to a second embodiment.

A semiconductor device according to a second embodiment is described below by referring to FIG. 3. FIG. 3 is a sectional view corresponding to FIG. 1B. A semiconductor device 2 of the second embodiment differs from the semiconductor device 1 of the first embodiment in that the gate electrode provided in the trench has a step-like structure with a narrower bottom portion. Note that the components that are identical to those in the first embodiment are denoted by the same reference numerals, and no description of the components will be given.

As FIG. 3 shows, a gate electrode 25 is provided in the trench 16 in the element unit of the semiconductor device 2. The gate electrode 25 extends from the top portion to the bottom portion with the insulator 17 provided between the gate electrode 25 and the internal surface of the trench 16. The gate electrode 25 is made of conductive-type poly crystalline silicon, for instance. Like the gate electrode 25 in the element unit, a gate electrode material 25a is provided in the trench 16 in the diode unit. The other configuration of the semiconductor device 2 is identical to the corresponding configuration of the semiconductor device 1 of the first embodiment.

The width, measured in the direction in which the trenches 16 are provided, of the gate electrode 25 is larger on the top-end side than on the bottom-end side. The wider upper-end side portion of the gate electrode 25 extends at least from the level as deep as the bottom surface of the $p^-$-type base layer 13 up to the level as high as the top surface of the $p^-$-type base layer 13. Thus, channels are allowed to be provided in the $p^-$-type base layer 13 on the side surfaces of each trench 16. The width, measured in the direction in which the trenches 16 are provided, of the bottom-end side portion of the gate electrode 25 is evenly narrow. The bottom-end side portion of the gate electrode 25 is contiguously provided from the upper-end-side portion of the gate electrode 25, so that the two portions of the gate electrode 25 together form a single body. The insulator 17 provided on the internal side surfaces of the trench 16 is thinner on the upper-end side and is thicker on the bottom-end side.

The gate electrode 25 which has a step-like structure with a wider upper-end side and a narrower bottom-end side has the maximum breakdown voltage at the pitch 31 for the trenches as the same as the double-electrode structure of the first embodiment including the embedded source electrode 18 and the gate electrode 19 (see FIG. 2).

The gate electrode material 25a in the diode unit has the same size as that of the gate electrode 25 in the element unit though a prescribed processing error should be tolerated.

The internal structure of each trench 16 in the element unit is basically the same as its counterpart in the diode unit, and only the pitch for the trenches 16 in the element unit differs from its counterparts in the diode unit. The element unit and the diode unit are provided in the same manufacturing processes as the same as the first embodiment.

The gate electrode 25 of the semiconductor device 2 extends deeper in the $n^-$-type drift layer 12 compared with the semiconductor device 1. Accordingly, a charge accumulation layer can be provided along the trenches 16 in the $n^-$-type drift layer 12. Consequently, an even lower on-resistance can be secured. Besides, the semiconductor device 2 has the same effects that the semiconductor device 1 has.

Figure 4:
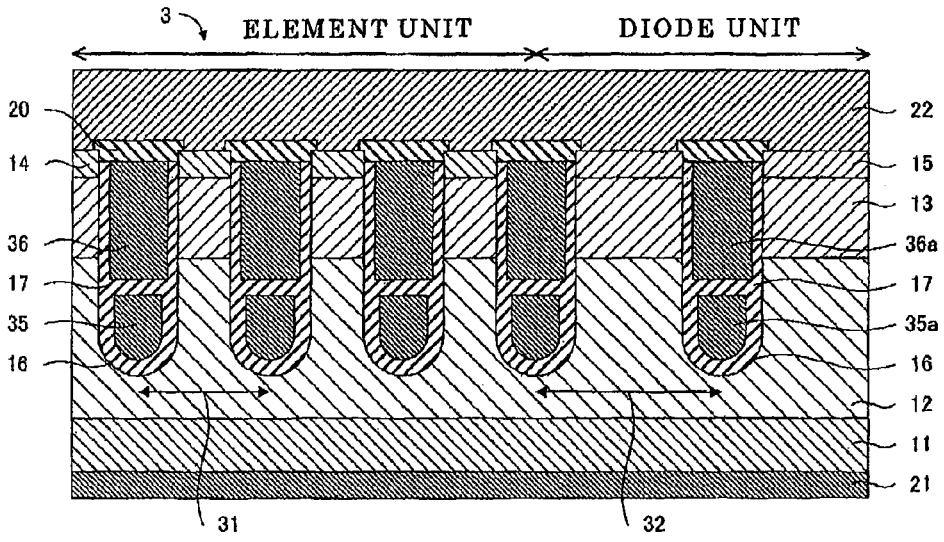
FIG. 4 is a cross-sectional view schematically showing a structure of a semiconductor device according to a modification of the second embodiment.

Next, a semiconductor device according to a modification of the second embodiment is described below by referring to FIG. 4. The semiconductor device 2 of the second embodiment has the single-body gate electrode 25 with a step-like structure. Meanwhile, as shown in FIG. 4, a semiconductor device 3 of the modification has a step-like double-electrode structure in which a wider gate electrode 36 on the upper-end side is separated from a narrower, bottom gate electrode 35 at the step portion. To give the same potential, both the gate electrode 36 and the bottom gate electrode 35 are connected commonly to a gate electrode (not illustrated) provided on the top surface. The diode unit is provided with a gate electrode 36a and a bottom gate electrode 35a corresponding respectively to the gate electrode 36 and the bottom gate electrode 35 in the element unit. Both the gate electrode 36a and the bottom gate electrode 35a are connected commonly to the gate electrode provided on the top surface.

The semiconductor device 3 as the modification of the second embodiment may also be regarded as a modification of the first embodiment. The semiconductor device 3 can be formed by connecting the embedded source electrode 18 not to the source electrode 22 but to a gate electrode provided on the top surface in the semiconductor device 1.

The semiconductor device 3 has the same effects that the semiconductor device 2 has.

In the embodiments described thus far, the insulator provided in each trench is made of a silicon oxide film. It is, however, possible to use an insulator with either a higher or a lower dielectric constant than the silicon oxide film for the purposes of further improving the performance concerning the breakdown voltage, the on-resistance, or the like. The film of either a higher dielectric constant or a lower dielectric constant may be used not only to replace the entire film in each trench but also to replace only a part of the film in each trench.

In addition, the semiconductor layers in the embodiments described thus far are made of silicon. It is, however, possible to use various compound semiconductors such as SiC compounds and GaN compounds. In addition, the embodiments described thus far concern n-channel MOSFETs. It is, however, possible to carry out the embodiments with p-channel MOSFETs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power semiconductor device, comprising:

an element unit comprising a vertical-type MOSFET, the vertical-type MOSFET comprising, a first semiconductor layer with a first conductivity type, a second semiconductor layer with the first conductivity type provided on a first main surface of the first semiconductor layer, an impurity concentration of the second semiconductor layer being lower than the first semiconductor layer, a third semiconductor layer with a second conductivity type provided on a surface of the second semiconductor layer, a fourth semiconductor layer with a first conductivity type selectively provided on a surface of the third semiconductor layer, a fifth semiconductor layer with the second conductivity type selectively provided on the surface of the third semiconductor layer, an insulator covering inner surfaces of a plurality of trenches, each trench penetrating the third semiconductor layer from a surface of the fourth semiconductor layer or a surface of the fifth semiconductor layer reaching the second semiconductor layer, the adjacent trenches being provided with a first interval in between, a first embedded conductive layer embedded at a bottom of the trench via the insulator, a second embedded conductive layer embedded at an upper portion of the first embedded conductive layer via the insulator, an interlayer insulator provided on the second embedded conductive layer, a first main electrode provided on a second main surface of the first semiconductor layer opposed to the first main surface, the first main electrode electrically connecting to the first semiconductor layer, a second main electrode provided on the a fourth semiconductor layer, the fifth semiconductor layer and the interlayer insulator, the second main electrode electrically connecting to the fourth semiconductor layer and the fifth semiconductor layer; and a diode unit adjacent to the element unit comprising, the first semiconductor layer, the second insulator semiconductor layer, the third semiconductor layer, the fifth semiconductor layer, the insulator covering the inner surfaces of the plurality of the trenches, the adjacent trenches being provided with a second interval in between, the second interval being larger than the first interval, the first embedded conductive layer, the second embedded conductive layer, the interlayer insulator, the first main electrode, and the second main electrode.

2. The power semiconductor device of claim 1, further comprising:

the insulator is provided between the first embedded conductive layer and the second embedded conductive layer.

3. The power semiconductor device of claim 1, wherein electrical potential of the first embedded conductive layer is the same as electrical potential of the second embedded conductive layer.

4. The power semiconductor device of claim 1, wherein the first embedded conductive layer is connected to the second main electrode.

5. The power semiconductor device of claim 1, wherein the first embedded conductive layer is a gate electrode.

6. The power semiconductor device of claim 1, wherein a first film thickness of the insulator being contact with a sidewall of the first embedded conductive layer is thicker than a second film thickness of the insulator being contact with a sidewall of the second embedded conductive layer.

7. The power semiconductor device of claim 1, wherein a width of the first embedded conductive layer is wider than a width of the second embedded conductive layer.

8. The power semiconductor device of claim 1, wherein both the first embedded conductive layer and the second embedded conductive layer are connected each other and act as gate electrodes.

9. The power semiconductor device of claim 1, wherein the fourth semiconductor layer and the fifth semiconductor layer are alternately arranged to a longitudinal direction of the trench in the element unit.

10. The power semiconductor device of claim 1, wherein a breakdown voltage of the diode unit is set to be lower than a breakdown voltage of the element unit.

11. A power semiconductor device, comprising:

an element unit comprising a vertical-type MOSFET, the vertical-type MOSFET comprising, a first semiconductor layer with a first conductivity type, a second semiconductor layer with the first conductivity type provided on a first main surface of the first semiconductor layer, an impurity concentration of the second semiconductor layer being lower than the first semiconductor layer, a third semiconductor layer with a second conductivity type provided on a surface of the second semiconductor layer, a fourth semiconductor layer with a first conductivity type selectively provided on a surface of the third semiconductor layer, a fifth semiconductor layer with the second conductivity type selectively provided on the surface of the third semiconductor layer, an insulator covering inner surfaces of a plurality of trenches, each trench penetrating the third semiconductor layer from a surface of the fourth semiconductor layer or a surface of the fifth semiconductor layer reaching the second semiconductor layer, a film thickness of a sidewall at a bottom side of the insulator opposed to the second semiconductor layer being thicker than a film thickness of a sidewall at an upper side of the insulator, the adjacent trenches being provided with a first interval in between, an embedded conductive layer embedded in the trench via the insulator, an interlayer insulator provided on the embedded conductive layer, a first main electrode provided on a second main surface of the first semiconductor layer opposed to the first main surface, the first main electrode electrically connecting to the first semiconductor layer, a second main electrode provided on the a fourth semiconductor layer, the fifth semiconductor layer and the interlayer insulator, the second main electrode electrically connecting to the fourth semiconductor layer and the fifth semiconductor layer; and a diode unit adjacent to the element unit comprising, the first semiconductor layer, the second insulator semiconductor layer, the third semiconductor layer, the fifth semiconductor layer, the insulator covering the inner surfaces of the plurality of the trenches, the adjacent trenches being provided with a second interval in between, the second interval being larger than the first interval, the first embedded conductive layer, the second embedded conductive layer, the interlayer insulator, the first main electrode, and the second main electrode.

12. The power semiconductor device of claim 11, wherein the embedded conductive layer is a gate electrode.

13. The power semiconductor device of claim 11, wherein a width of the embedded conductive layer being in contact with a sidewall at a bottom side of the insulator is wider than a width of the embedded conductive layer being in contact with a sidewall at an upper side of the insulator, a thickness of the sidewall at the bottom side being thicker and a thickness of the sidewall at the upper side being thinner.

14. The power semiconductor device of claim 11, wherein the fourth semiconductor layer and the fifth semiconductor layer are alternately arranged to a longitudinal direction of the trench in the element unit.

15. The power semiconductor device of claim 11, wherein a breakdown voltage of the diode unit is set to be lower than a breakdown voltage of the element unit.

*16. A power semiconductor device, comprising:*

*an element unit and a diode unit, the element unit comprising a vertical-type MOSFET, and the diode unit comprising a diode, the power semiconductor device having,*

*a first semiconductor layer of a first conductivity type, a dopant concentration of first semiconductor layer in the element unit being same as a dopant concentration of the first semiconductor layer in the diode unit,*

*a second semiconductor layer of a second conductivity type provided on the first semiconductor layer,*

*a third semiconductor layer of the first conductivity type provided on the second semiconductor layer in the element unit,*

*a source electrode electrically connected to the third semiconductor layer of the element unit,*

*a drain electrode electrically connected to the first semiconductor layer of the element unit,*

*a plurality of first trenches provided in the element unit having a first interval therebetween, each of the first trenches extending from a location within the third semiconductor layer and into the first semiconductor layer,*

*a gate electrode provided in the first trenches in the element unit, the gate electrode located adjacent to the second semiconductor layer, and spaced from the second semiconductor layer by a first insulating film having a first thickness,*

*a first electrode provided in the first trenches in the element unit, the first electrode located under the gate electrode and spaced therefrom by a second insulating film, and the first electrode located adjacent to the first semiconductor layer and spaced therefrom by a third insulating film having a thickness greater than a thickness of the first insulating film,*

*a plurality of second trenches provided in the first semiconductor layer in the diode unit, the second trenches having an interval therebetween greater than the first interval, at least one of the second trenches dividing a p-n junction formed by the first semiconductor layer and the second semiconductor layer in the diode unit, and*

*a second electrode provided in the second trenches, the second electrode spaced from the first semiconductor layer by a fourth insulating film.*

*17. The power semiconductor device of claim 16, wherein the first interval is equal to a minimum design rule size of the element unit and the diode unit.*

*18. The power semiconductor device of claim 16, wherein the first electrode is connected to the source electrode.*

*19. The power semiconductor device of claim 16, wherein the second electrode is connected to the source electrode.*

*20. The power semiconductor device of claim 16, wherein the first insulating film, the second insulating film and the third insulating film are continuous.*

* * * * *